United States Patent [19]

Fournel et al.

[11] Patent Number: 5,430,319
[45] Date of Patent: Jul. 4, 1995

[54] RESISTOR-CAPACITOR-TRANSISTOR TYPE INTEGRATED CIRCUIT, METHOD FOR THE MANUFACTURE OF SUCH A CIRCUIT AND APPLICATION TO AN OSCILLATOR

[75] Inventors: Richard P. Fournel, La Fontanil; François Tailliet, Epinay sur Seine, both of France

[73] Assignee: SGS-Thomson Microelectronics, S.A., Gentilly, France

[21] Appl. No.: 246,070

[22] Filed: May 19, 1994

[30] Foreign Application Priority Data

May 28, 1993 [FR] France ................. 93 06481

[51] Int. Cl.6 ...................... H01L 27/04; H03K 3/354
[52] U.S. Cl. .................................. 257/379; 257/380; 257/533; 331/111
[58] Field of Search ............... 331/111; 257/533, 296, 257/379, 380

[56] References Cited

U.S. PATENT DOCUMENTS 3,471,755 10/1969 Bilotti .
4,285,001 8/1981 Gerzberg et al. ............ 257/533 X

FOREIGN PATENT DOCUMENTS 1424482 12/1965 France .

Primary Examiner—Siegfried H. Grimm
Attorney, Agent, or Firm—Robert Groover

[57] ABSTRACT

A resistor-capacitor-transistor type of integrated circuit comprises mainly a non-self-aligned N diffusion bar 1 covered with a polysilicon plate, and a drain type N diffusion, self-aligned by the polysilicon plate. The resulting structure is a distributed resistor-capacitor-transistor quadripole whose main characteristics are that it is very compact and that the time taken by the capacitor to get discharged through the transistor is independent of the dimensions of the structure.

8 Claims, 3 Drawing Sheets

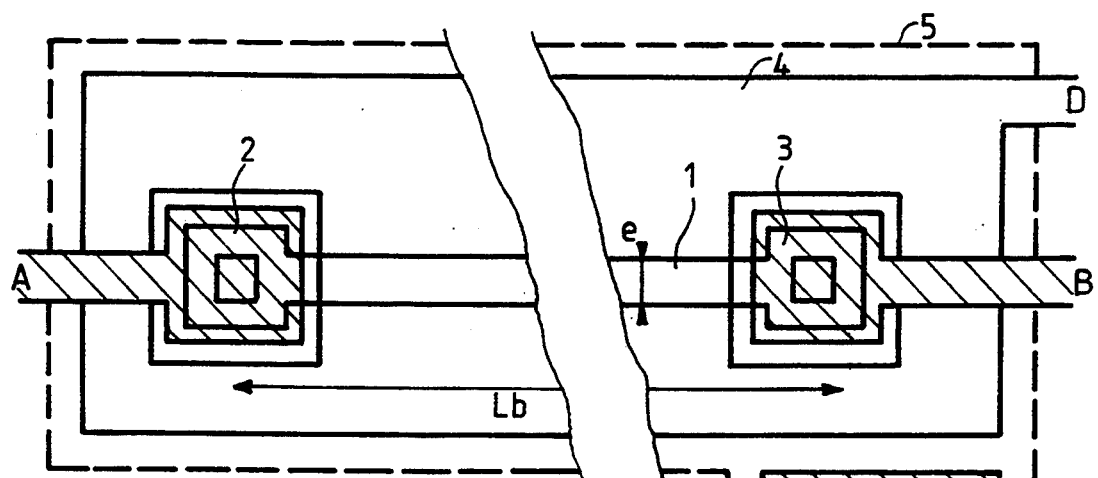
FIG_1a
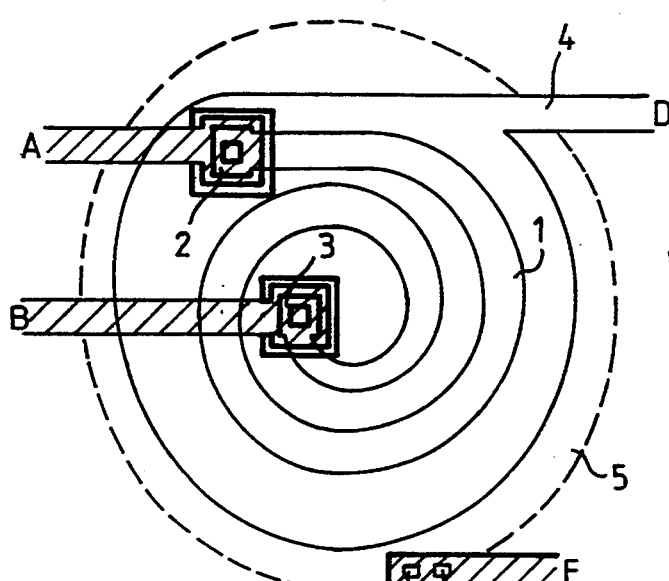
FIG_1b
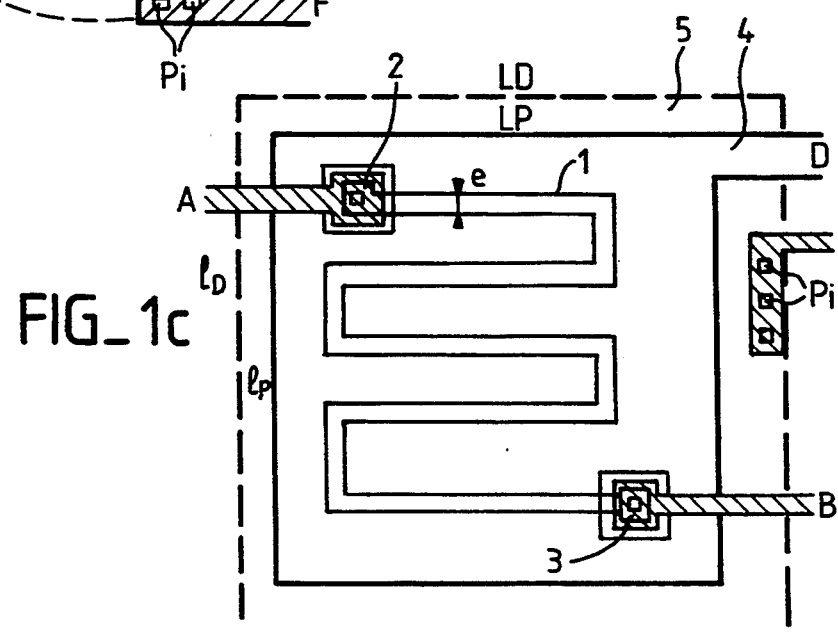
FIG_1c

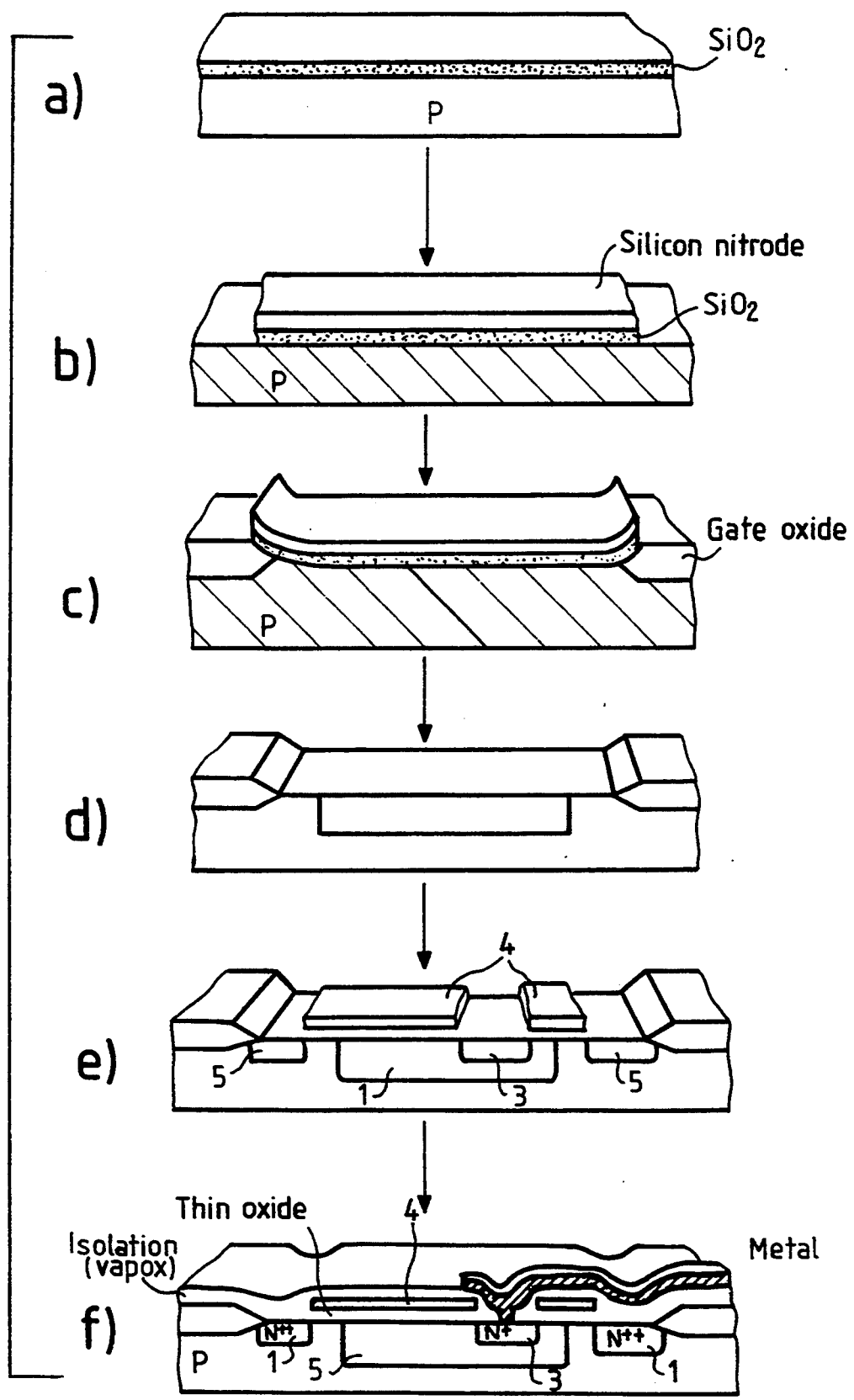
FIG_2

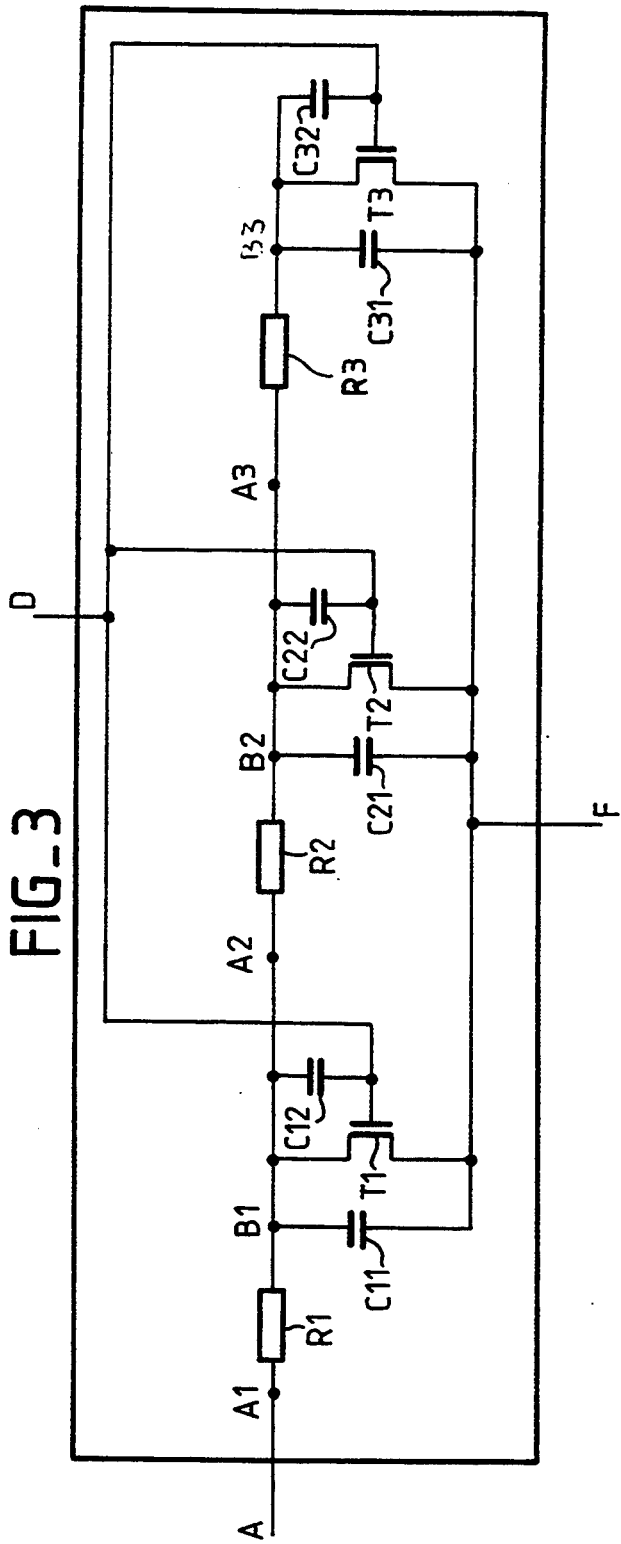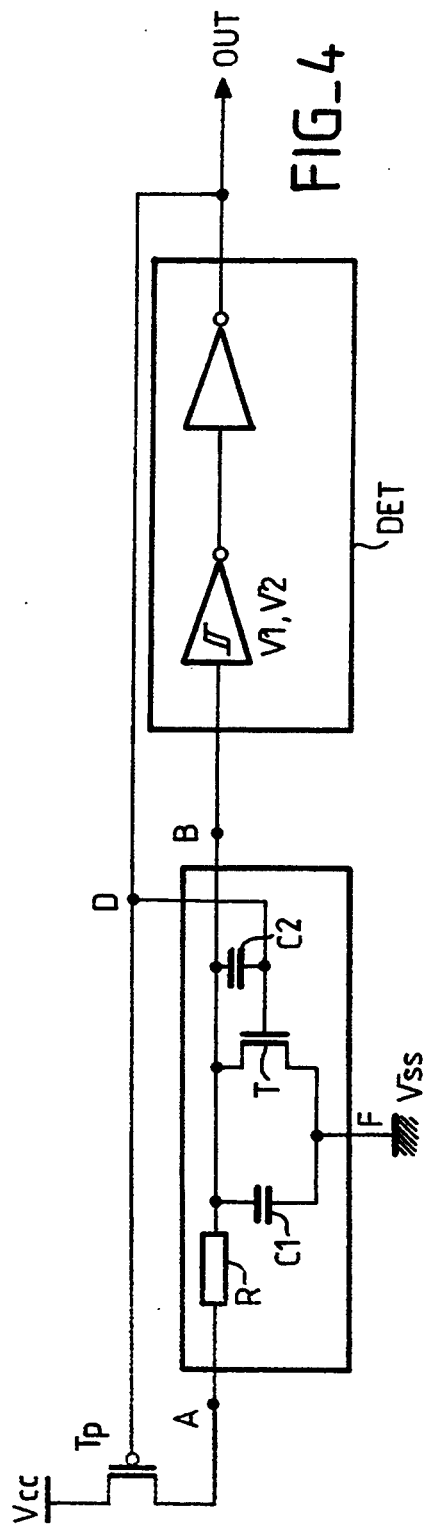

RESISTOR-CAPACITOR-TRANSISTOR TYPE INTEGRATED CIRCUIT, METHOD FOR THE MANUFACTURE OF SUCH A CIRCUIT AND APPLICATION TO AN OSCILLATOR

BACKGROUND OF THE INVENTION

The invention relates to a resistor-capacitor-transistor type of integrated circuit. It can be applied notably to oscillators.

RC type circuits are used notably in relaxation oscillators. These oscillators have a capacitor that is charged by means of a resistor and discharged by means of a transistor. The sizes and values of these three discrete elements have a direct influence on the time taken to charge and discharge the capacitor. In particular, the greater the capacitance value of the capacitor, the slower the discharging operation and greater the size needed for the discharging transistor if the discharging is to take place as swiftly as possible. In practice, the discharging is highly dependent on the characteristics of the discrete elements (the capacitor and the transistor). With present-day technologies, the discharging thus requires a minimum of two to five nanoseconds for very large capacitance values of the order of 10 pF ($10.10^{-12}$ farads). Now the charging and discharging time has a direct influence on the frequency that can be obtained with the relaxation oscillator. The frequency, therefore, is itself also dependent on the characteristics of the discrete charging and discharging elements and the minimum time taken to discharge the capacitor limits the frequency. Thus, with present-day technologies, a maximum of 10 to 20 megahertz are obtained at output of a relaxation oscillator.

Higher oscillation frequencies are however sought in certain applications, notably for microprocessors.

An object of the invention is a resistor-capacitor-transistor integrated circuit that enables discharging that is speedier and independent of the values of the resistance and capacitance values of the resistor and capacitor. For a given technology, there is a discharging time that is small and fixed, notably whatever the capacitance value of the capacitor.

The structure of the invention is furthermore advantageously compact.

SUMMARY OF THE INVENTION

As claimed, the invention relates to an integrated circuit comprising a substrate or a well with doping of a first type (P type) and, in this substrate or this well:
- a first diffusion with a second (N+) type of doping in the form of a bar with a length Lb and a width e, provided at its two ends with a first connection terminal A and a second connection terminal B;
- a polysilicon plate that covers the bar entirely and has an extension forming a third connection terminal D;
- a second diffusion with a second (N++) type of doping, self-aligned by the polysilicon plate and provided with a fourth connection terminal F;
the integrated circuit thus constituted forming a quadripole A, B, D, F of the resistor-capacitor-transistor type.

The first shape of the bar could be linear, folded in a serpentine form or spirally coiled depending on the space requirement and length desired.

The invention also relates to the manufacturing method to form a quadripole A, B, D, F of the resistor-capacitor-transistor type which comprises chiefly:
- the making of a diffusion bar with high doping of a second type;
- the forming of a gate oxide in a window that is wider than the bar, demarcated by the thick oxide;
- the covering of the bar with a polysilicon plate;
- the making of a diffusion with doping of the same type as that of the bar, this diffusion being self-aligned by the polysilicon plate and demarcated by the thick oxide;
- the connection of each end of the bar to a first connection terminal A and a second connection terminal B;
- the connection of the polycrystalline plate to a third connection terminal D;
- the connection of the self-aligned diffusion to a fourth connection terminal F;
to form a quadripole A, B, D, F of the resistor-capacitor-transistor type.

The circuit obtained is a quadripole that may advantageously be used in a relaxation oscillator. An oscillator such as this preferably has:
- a quadripole A, B, D, F according to the invention;
- a charging transistor Tp series-connected between a charging voltage Vcc and the terminal A of the quadripole, with its gate connected to the terminal D of the quadripole;
- an output stage DET having its input connected to the terminal B of the quadripole and its output connected to the terminal D of the quadripole, this output stage giving a first logic state at output for an input voltage that is higher than a first threshold and a second logic state at output for an input voltage that is lower than a second threshold.

BRIEF DESCRIPTION OF THE DRAWINGS

Other features and advantages of the invention are described in detail in the following description, made with reference to the appended drawings of which:

FIG. 1a shows a quadripole circuit according to the invention;

FIG. 1b shows a variant of a circuit according to the invention;

FIG. 1c shows another variant of a circuit according to the invention;

FIG. 2 shows a sectional view of different steps a) to f) in the manufacture of a circuit according to invention;

FIG. 3 is an approximate electronic model of the quadripole of the invention, and FIG. 4 shows a relaxation oscillator circuit using the quadripole of the invention.

MORE DETAILED DESCRIPTION

The circuit of the invention, as shown in FIGS. 1a, 1b, 1c, comprises chiefly:
- a first (N+) diffusion in the form of a bar 1 with a length Lb and a width e made in a P type substrate. The two ends of the bar are referenced 2, 3.
- a polysilicon plate 4 that covers the diffusion bar 1.
- a second (N++) diffusion referenced 5, self-aligned by the polysilicon plate. There is then, in a standard way, a thin oxide (not shown) beneath the polysilicon plate and on the self-aligned diffusion.

The N type diffusion bar 1 may be linear (FIG. 1a), or else spirally coiled (FIG. 1b) or again folded in a serpentine form (FIG. 1c). The shape of the bar depends essentially on the length Lb envisaged for the bar and the space available to make the circuit: the folded or wound shapes offer greater compactness than the linear shape.

The ends 2, 3 of the bar are connected to the connection terminals A, B.

In one example shown, the connection of the two ends of the bar is done with metal. To this end, two apertures are designed in the polysilicon plate at the position of the two ends 2, 3 of the bar 1, and it is through these apertures that the metallization is done. The metallizations form a strip in an upper plane parallel to the polysilicon plate.

However, the connection could be made, for example, with a second polysilicon level (multi-poly circuits).

The polysilicon plate 4 is of the rectangular (or even square) type as shown in FIG. 1c or else, again, it is circular (FIG. 1b). It is connected to a third connection terminal D. In the unit shown, the plate is provided with a strip-shaped extension in the plane of the plate. This strip-shaped extension constitutes this third connection terminal D of the circuit (FIG. 1a, 1b, 1c). But it is also possible to place the polysilicon in contact with a metallization to form this third terminal (not shown).

The self-aligned diffusion 5 too is connected to a connection terminal F. In the example (FIG. 1c), this connection is made by means of a metallization that is positioned vertically (FIG. 2, step f), preferably at several points Pi, to the diffusion 5, starting from an upper plane parallel to the polysilicon plate, this being a plane in which it forms a strip that constitutes the connection terminal F.

Should the connections be metallizations, the connection terminals may be all in the same plane of metallization above the polysilicon plate (as shown) or in different planes (in a circuit with several layers of metallization).

The method of manufacturing this circuit necessitates, chiefly, for a P type substrate:
the making of an N type diffusion bar according to a non self-aligned method;
the formation of a gate oxide in a window that is wider than the bar, demarcated by thick oxide;
the covering of the bar with a polysilicon plate;
the making of a diffusion with doping of the same (N) type as that of the bar, this diffusion being self-aligned by the polysilicon plate and demarcated by the thick oxide;
the connection of each end 2, 3 of the bar 1 to a first connection terminal A and a second connection terminal B;
the connection of the polysilicon plate to a third connection terminal D;
the connection of the self-aligned diffusion to a fourth connection terminal F.

Thus, in a standard way for example, in MOS technology using a P type substrate, the method will comprise the following main steps (FIG. 2):
thermal oxidation of silicon (step a);
deposition of a layer of silicon nitride and etching of the nitride and of the oxide (step b);
P type (boron) insulating ion implantation;
oxide growth to form the thick field oxide (step c);
removal of the nitride;
removal of the thin oxide;
masking and N type (arsenic) ion implantation to form the non-self-aligned diffusion bar 1 (step d);
growth of the gate oxide;
deposition of a polysilicon layer and N type (phosphorus) doping of the polysilicon;
photolithography and etching of the polysilicon to form the plate 4 (with the apertures for the contacts on the bar);
source-drain N type (arsenic) ion implantation to form the self-aligned diffusion 5 (step e);
reoxidation;
deposition of an insulating oxide layer (vapox);
opening of the contacts in the insulating oxide layer;
deposition of a metal layer;
etching of the metal (step f);
deposition of a passivation layer and etching of the passivation layer.

This circuit could very well be out of an N type substrate or else in a well.

The values of doping used are those of the standard techniques for the different types of diffusion.

For the bar 1, made according to a non-self-aligned method, for example according to the method described here above and commonly called the "capa-implant" method, the level of doping with impurities is typically equal to $10^{19}$ cm$^{-3}$, thus making it possible to have a resistivity of 100 ohms per square. Variants of doping levels enabling an increase in resistivity are possible, these variants of up to a doping level of $10^{17}$ cm$^{-3}$ making it possible to obtain resistivity of 5 kilo-ohms per square.

In the method described, the bar is less doped (it has N+ doping) than the self-aligned diffusion 5 (which has N++ doping). However, this is only an exemplary embodiment that should not limit the scope of the invention. Other doping ratios are possible. In particular, it is possible to have identical doping levels for the bar 1 and the self-aligned diffusion 5.

For the self-aligned diffusion 5, it is possible to choose a typical doping level for a transistor drain or source (low-energy ion implantation through a gate oxide) i.e. a doping level of $10^{20}$ cm$^{-3}$.

The circuit obtained is a quadripole A, B, D, F of the resistor-capacitor-transistor type. However, these elements cannot be made discrete or separate: they are distributed all along the N type diffusion bar.

An equivalent electronic model should include several elementary stages, each comprising a resistor, a capacitor and a transistor, characterized by mean values.

It can be estimated that three or four elementary stages make it possible to cover 90% of the real operation of a quadripole such as this.

The distributed resistance is formed by the diffusion bar 1. Its value depends, firstly, on the manufacturing method used (capa-implant for example) and on the doping level chosen. This fixes the resistivity per square of the bar. It depends, furthermore, on the real surface area of the bar.

Indeed, we have $R = R_\square \cdot Lb/e$ for a linear bar.

Known correctives must be taken should the resistor be folded in a serpentine form or spirally coiled.

In the case of the manufacturing method described with reference to FIG. 2, with a doping level of $10^{19}$ cm$^{-3}$, the resistance per square is of the order of 100 ohms/$\square$.

The distributed capacitance is formed by the distributed capacitance C1 of the bar/substrate junction as well as the distributed bar/polysilicon capacitance C2 (the references C1 and C2 being used herein to designate capacitors as well as capacitance values).

The total equivalent capacitance C is therefore:

$$C = C1 \text{ (bar/substrate)} + C2 \text{ (bar/polysilicon)}.$$

In the particular case of a linear transistor (FIG. 1a), the distributed transistor notably has, as the minimum length of the channel, the length of the bar beneath the polysilicon plate (Lb). The gate of the distributed transistor T is formed by the polysilicon plate. Its source is connected to the terminal F of the quadripole.

In the corresponding electronic model, as shown in FIG. 3 with three elementary stages E1, E2 and E3 there is thus, for each stage Ei (where i=1, 2 or 3):

an elementary resistor Ri between the nodes Ai and Bi;

an bar/substrate junction elementary capacitor Ci1 between the node Bi and the substrate connected to the terminal F, a transistor Ti between the node Bi and the substrate, the gate of which is connected to the polysilicon plate (terminal D of the quadripole) and a bar/polysilicon junction elementary capacitor Ci2 between the node Bi and the gate of the transistor (terminal D of the quadripole).

In one exemplary embodiment of the circuit according to the FIG. 1c, with notably the following dimensions:

For the bar:

$$e = 2 \ \mu m \ \text{doping} = 10^{-19} \ cm^3$$

$$Lb = 250 \ \mu m$$

$$R_\square = 100 \ \Omega/\square$$

for the polysilicon plate:

$$lp = 25 \ \mu m$$

$$Lp = 260 \ \mu m$$

for the self-aligned diffusion:

$$ld = 30 \ \mu m$$

$$Ld = 270 \ \mu m$$

with an equivalent capacity CE per square of 1,5 farads/□ given by:

$$Ce = 1{,}3 \ (C1) \ \text{farads}/\square + 0{,}2 \ (C2) \ \text{farads}/\square.$$

There is thus obtained:

a total distributed resistance R of 31 kilo-ohms (in making the corrections due to the serpentine shape) and a total distributed capacitance C of $0{,}750 \cdot 10^{-12}$ farad (given by $C = Ce \times Lb \times e$), for total dimensions of the circuit that are small, namely in the range of 900 $\mu m^2$.

The circuit is indeed compact since the three elements, the resistor, the capacitor and the transistor, are obtained by the same structure and not by three different structures. The compactness can furthermore be improved by using devices of design as can be seen, for example, in FIG. 1c with a recess in the polysilicon at the metallization of the self-aligned diffusion 5.

An immediate application of such a circuit is a relaxation oscillator as shown in FIG. 4. This figure shows the quadripole A, B, D, F in symbolic form, showing only one stage (R, C, T) of the equivalent electronic model.

An oscillator such as this will typically comprise:

a P type transistor Tp series-connected between the charging voltage Vcc and the terminal A of the quadripole, its gate being connected to the terminal D of the quadripole;

a threshold detection stage DET comprising at least two inverters, series-connected between the terminal D and the terminal B of the quadripole and delivering an output OUT. The terminal F of the quadripole is connected to the ground.

Preferably, one of the inverters is a Schmitt trigger with a top/bottom switch-over threshold V1 different from the top/bottom switch-over threshold V2.

The following is the operation:

When the output of the detector DET is at 0 volts (low or zero logic state), we then have:

0 volts on the gate of the distributed transistor T of the quadripole: it is off;

0 volts on the gate of the charging transistor Tp: it is therefore on and brings the charging voltage Vcc to the terminal A of the quadripole: the capacitors C1 and C2 forming the total distributed capacitance C get charged through the distributed resistor R: the voltage at the terminal B rises and goes beyond the bottom/top threshold V1 of the detector which switches over: its output OUT goes to 5 volts (top logic state or "1"). We therefore have five volts at the terminal D of the quadripole.

We then have:

5 volts at the gate of the charging transistor Tp; it is off and the terminal A is floating;

5 volts at the gate of the distributed transistor T: it is on. The capacitors C1 and C2 which form the total distributed capacitor C get discharged through the distributed transistor T. The voltage at the terminal B of the quadripole falls below the top/bottom threshold V2 of the detector which switches back to zero volts.

The discharging with the circuit of the invention is extremely fast owing to the fact that the elements are distributed all along the bar. If the bar is long, the capacitor is big but the equivalent transistor is also very big.

In practice, whatever may be the dimensions chosen for the quadripole, the discharging time is always the same in a given technology (doping): it is of the order of one nanosecond. In the numerical example taken for the quadripole, with VCC equal to 5 volts, V1 in the range of 4 volts and V2 in the range of 1 volt, there are 45 nanoseconds of charging and 1 nanosecond of discharging. The dimensions R, C influence the charging time. By contrast, the discharging is independent of the dimensions of R, C, T. It is then possible to obtain a high-frequency pulse signal at output OUT.

It is thus possible, at output of a relaxation oscillator, to obtain a pulse signal with a frequency of the order of 20 to 40 MHz through the quadripole of the invention, a main characteristic of which is the discharging time of the capacitor through the transistor, this time being independent of the dimensions of the structure of the quadripole which furthermore is very compact.

What is claimed is:

1. An integrated circuit comprising a substrate or a well with doping of a first type (P type) and, in this substrate or well:

a first diffusion with a second (N+) type of doping in the form of a bar with a length Lb and a width e, provided at its two ends with a first connection terminal A and a second connection terminal B;

a polycrystalline plate that covers the bar entirely and has an extension forming a third connection terminal D;

a second diffusion with a second (N++) type of doping, self-aligned by the polycrystalline plate and provided with a fourth connection terminal F;

the integrated circuit thus constituted forming a quadripole A, B, D, F of the resistor-capacitor-transistor type.

2. An integrated circuit according to claim 1, wherein the bar is linear.

3. An integrated circuit according to claim 1, wherein the bar is spirally coiled.

4. An integrated circuit according to claim 1, wherein the bar is folded in a serpentine shape.

5. A integrated circuit according to claim 1, wherein the bar is less doped (with N+ doping) than the self-aligned diffusion (with N++ doping).

6. A method for the manufacturing of an integrated circuit in a substrate or a well with a first type of doping, wherein said method comprises the following steps:

the making of a bar with non-self-aligned diffusion of a second type;

the forming of a gate oxide in a window that is wider than the bar, demarcated by the thick oxide;

the covering of the bar with a polysilicon plate;

the making of a diffusion of the second type, this diffusion being self-aligned by the polysilicon plate and demarcated by the thick oxide;

the connection of each end of the bar to a first connection terminal A and a second connection terminal B;

the connection of a third connection terminal D to the polysilicon plate;

the connection of the self-aligned diffusion to a fourth connection terminal F;

to form a quadripole A, B, D, F of the resistor-capacitor-transistor type.

7. A relaxation oscillator comprising:

a quadripole A, B, D, F according to the claim 1;

a charging transistor Tp series-connected between a charging voltage Vcc and the first connection terminal A of the quadripole, with its gate connected to the third connection terminal D of the quadripole;

an output stage DET with at least one detection threshold, having its input connected to the second connection terminal B of the quadripole and its output connected to the third connection terminal D of the quadripole;

this output stage giving a first logic state at output for an input voltage that is higher than the detection threshold and a second logic state at output for an input voltage that is lower than the detection threshold.

8. A relaxation oscillator according to claim 7, wherein the output stage has a first bottom/top voltage threshold (V1) and a second bottom/top voltage threshold (V2).

* * * * *